(12) United States Patent
Tansu et al.

(10) Patent No.: US 8,907,321 B2
(45) Date of Patent: Dec. 9, 2014

(54) NITRIDE BASED QUANTUM WELL LIGHT-EMITTING DEVICES HAVING IMPROVED CURRENT INJECTION EFFICIENCY

(75) Inventors: Nelson Tansu, Bethlehem, PA (US); Hongping Zhao, Bethlehem, PA (US); Guangyu Liu, Bethlehem, PA (US); Ronald Arif, Bethlehem, PA (US)

(73) Assignee: Lehigh Univeristy, Bethlehem, PA (US)

( * ) Notice: Subject to any disclaimer, the term of this patent is extended or adjusted under 35 U.S.C. 154(b) by 579 days.

(21) Appl. No.: 12/967,367

(22) Filed: Dec. 14, 2010

(65) Prior Publication Data

US 2011/0147702 A1    Jun. 23, 2011

Related U.S. Application Data

(60) Provisional application No. 61/286,821, filed on Dec. 16, 2009.

(51) Int. Cl.
*H01L 29/06*    (2006.01)
*H01L 33/06*    (2010.01)
*H01L 33/32*    (2010.01)

(52) U.S. Cl.
CPC ................. *H01L 33/06* (2013.01); *H01L 33/32* (2013.01)
USPC .......................... 257/14; 257/13; 257/E33.028

(58) Field of Classification Search
USPC .................................................. 257/E33.028
See application file for complete search history.

(56) References Cited

U.S. PATENT DOCUMENTS

| 5,300,794 A | 4/1994 | Melman et al. |
| 6,515,313 B1 | 2/2003 | Ibbetson et al. |
| 7,616,672 B2 | 11/2009 | Shakuda |

(Continued)

FOREIGN PATENT DOCUMENTS

| CN | 101527342 A | 9/2009 |
| GB | 2 432 715 A1 | 5/2007 |

(Continued)

OTHER PUBLICATIONS

Xu et al., Applied Physics Letters, v. 94 011113 (2009) [http://www.ecse.rpi.edu/~schubert/Reprints/2009-Xu-J-et-al-(APL)-Reduction-in-efficiency-droop-in-polarization-matched-GaInN-GaInN-LEDs.pdf].

(Continued)

*Primary Examiner* — Daniel Luke
(74) *Attorney, Agent, or Firm* — Saul Ewing LLP

(57) ABSTRACT

A III-nitride based device provides improved current injection efficiency by reducing thermionic carrier escape at high current density. The device includes a quantum well active layer and a pair of multi-layer barrier layers arranged symmetrically about the active layer. Each multi-layer barrier layer includes an inner layer abutting the active layer; and an outer layer abutting the inner layer. The inner barrier layer has a bandgap greater than that of the outer barrier layer. Both the inner and the outer barrier layer have bandgaps greater than that of the active layer. InGaN may be employed in the active layer, AlInN, AlInGaN or AlGaN may be employed in the inner barrier layer, and GaN may be employed in the outer barrier layer. Preferably, the inner layer is thin relative to the other layers. In one embodiment the inner barrier and active layers are 15 Å and 24 Å thick, respectively.

11 Claims, 5 Drawing Sheets

(56) References Cited

U.S. PATENT DOCUMENTS

| | | | |
|---|---|---|---|
| 7,629,619 | B2 | 12/2009 | Taki et al. |
| 7,633,083 | B2 | 12/2009 | Lester et al. |
| 2006/0169990 | A1* | 8/2006 | Taki et al. .................. 257/79 |
| 2007/0272915 | A1* | 11/2007 | Nakamura et al. .......... 257/14 |
| 2009/0050875 | A1 | 2/2009 | Kim et al. |
| 2009/0050924 | A1 | 2/2009 | Edmond |
| 2010/0327278 | A1* | 12/2010 | Ahn ............................. 257/43 |

FOREIGN PATENT DOCUMENTS

| | | |
|---|---|---|
| JP | 2007-36239 A | 2/2007 |
| JP | 2008227103 A | 9/2008 |
| WO | 00/54342 A1 | 9/2000 |
| WO | 2009/066099 A1 | 5/2009 |

OTHER PUBLICATIONS

Technical Program for ISSLED 2008, Apr. 27-May 3, 2008 [http://www.tms.org/Meetings/Specialty/Issled08/PDFs/ISSLED08FinalProgram.pdf].

* cited by examiner

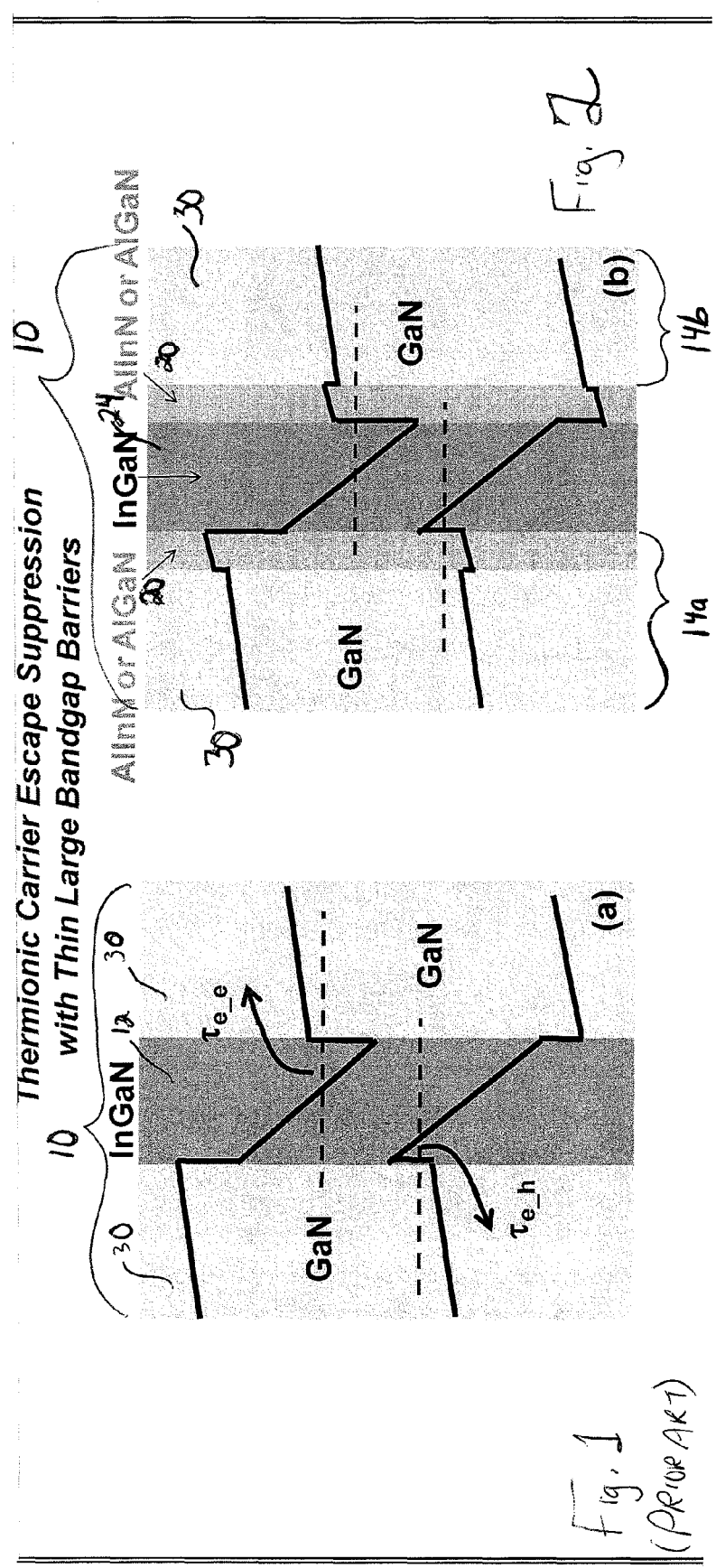

NITRIDE BASED QUANTUM WELL LIGHT-EMITTING DEVICES HAVING IMPROVED CURRENT INJECTION EFFICIENCY

CROSS-REFERENCE TO RELATED APPLICATIONS

This application claims the benefit of priority under 35 U.S.C. §119(e) of U.S. Provisional Patent Application No. 61/286,821, filed Dec. 16, 2009, the entire disclosure of which is hereby incorporated herein by reference.

STATEMENT OF GOVERNMENT INTEREST

This invention was made with government support under U.S. National Science Foundation—ECCS Award #0701421, and US Department of Energy—NETL (DE-FC26-08NT01581). The government has certain rights in the invention.

FIELD OF THE INVENTION

The present invention relates generally to semiconductor light-emitting devices (LEDs) including a III-nitride based a quantum well, and more particularly to a semiconductor LED having improved current injection efficiency (reduced efficiency-droop).

DISCUSSION OF RELATED ART

A quantum well is a potential boundary that confines particles to a planar, substantially two dimension region. As used herein, the term "quantum well" refers to a thin-layer structure comprising alternate layers consisting of a first semiconductor layer with a thickness smaller than the de Broglie wavelength of about 200 Å to 300 Å with respect to electrons or holes and at least a second semiconductor layer with a bandgap greater than that of the first semiconductor layer. A "substrate" is an underlying template or substratum can such as a sapphire template, an Si substrate, SiC substrate or ZnO substrate.

The electrons and holes in the quantum well layer cannot move freely in the direction of thickness and are substantially confined two-dimensionally in a plane perpendicular to the thickness direction. The two-dimensional confinement increases bound energy of Coulombic electron, and hole attraction so that excitons occur under heat energy at room temperature.

A quantum well can be formed as part of a semiconductor by having a material, such as indium gallium nitride (InGaN), sandwiched between two layers of a higher-bandgap material such as gallium nitride (GaN). FIG. 1 is a diagrammatic representation of an exemplary prior art gallium-nitride-based quantum well 10 that includes an active layer 12 of InGaN sandwiched between higher bandgap barrier layers 30 of GaN. For example, the InGaN active layer 12 may have a thickness of approximately 10 Å to 50 Å, and each barrier layer 30 may have a thickness of approximately 50 Å to 250 Å.

A quantum well effect can be achieved in a device by alternating tens to hundreds of two kinds of very thin semiconductor layers with different bandgap characteristics. As well known in the art, such structures can be grown by molecular beam epitaxy (MBE) and chemical vapor deposition (MO-CVD). These procedures can provide a layer having a thickness as small as a molecular monolayer.

Because of a quasi-two dimensional nature, electrons in a quantum well have a sharper density of state than bulk materials. As a result, quantum well structures are in wide use in diode lasers. They are also used to make HEMTs (High Electron Mobility Transistors), which are used in low-noise electronics.

Quantum well-based emitters (LEDs and diode lasers) in the blue, green, and red regime are important for solid state lighting, display and medical applications. These applications require highly efficient blue, green, and red diodes integrated in a single semiconductor chip. However, only low efficiency can be attained with typical gallium nitride-based quantum wells, such as InGaN-based quantum wells, particularly as emission wavelength is extended beyond green spectral regime and into the yellow and red spectral regimes.

The use of c-plane InGaN-based quantum well light-emitting diodes (LEDs) suffers from a reduction in efficiency at high operating current density, which is referred as "efficiency-droop." The external quantum efficiency (EQE) reaches its maximum and starts to drop at current density of 10-70 $A/cm^2$. Though uncertain, it has been believed that possible causes of efficiency-droop in III-Nitride LEDs included 1) carrier leakage, 2) large Auger recombination at high carrier density, 3) decreased carrier localization at In-rich regions for high current injection densities, 4) hole transport impediment and consequent electron leakage, and 5) junction heating. Traditional approaches to enhance radiative efficiency have been based on novel quantum well designs, and enhanced optical matrix elements have been demonstrated.

There remains a need for quantum well structures with high internal quantum efficiency even at high operating current densities (e.g., for $J>200$ $A/cm^2$, and preferably up to $J>650$ $A/cm^2$) to reduce "efficiency-droop."

SUMMARY

The present invention provides a III-nitride based (e.g., GaN based) semiconductor device including a symmetrical arrangement of multi-layer barrier layers that provides improved internal quantum efficiency and reduced efficiency-droop by suppressing thermionic carrier escape from the quantum well active region, even at high (e.g., for $J>200$ $A/cm^2$, and preferably up to $J>650$ $A/cm^2$) current density. The symmetrical arrangement includes a quantum well active layer of a first nitride-based material having a relatively low bandgap characteristic (such as InGaN), and a pair of matched multi-layer barrier layers sandwiching the quantum well active layer. Each multi-layer barrier layer includes at least two layers of distinctly different materials—an inner layer abutting the quantum well active layer that is constructed of a relatively higher-bandgap material (such as AlInN or AlnGaN or AlGaN), and an outer layer of a relatively lower-bandgap material (such as GaN) having a higher bandgap than the bandgap of the quantum well active layer. In a preferred embodiment, the inner barrier layer is thinner than the outer barrier layer, and optionally, thinner also than the active layer.

Such a symmetrical arrangement of matched, multi-layer barrier layers immediately adjacent a quantum well active layer advantageously reduces carrier leakage from the quantum well active layer (e.g., InGaN) to an adjacent barrier region (e.g., GaN), even at high carrier density, which in turn leads to reduction of efficiency-droop.

BRIEF SUMMARY OF DRAWINGS

The present invention will now be described by way of example with reference to the following drawings in which:

FIG. 1 is a diagrammatic representation of an exemplary prior art semiconductor LED's gallium-nitride-based quantum well that includes an InGaN quantum well active layer sandwiched between higher bandgap layers of GaN;

FIG. 2 is a diagrammatic representation of a semiconductor LED's gallium-nitride-based quantum well that includes an InGaN quantum well active layer sandwiched between a pair of multi-layer barrier layers, in accordance with an exemplary embodiment of the present invention;

DETAILED DESCRIPTION

Figure 3:
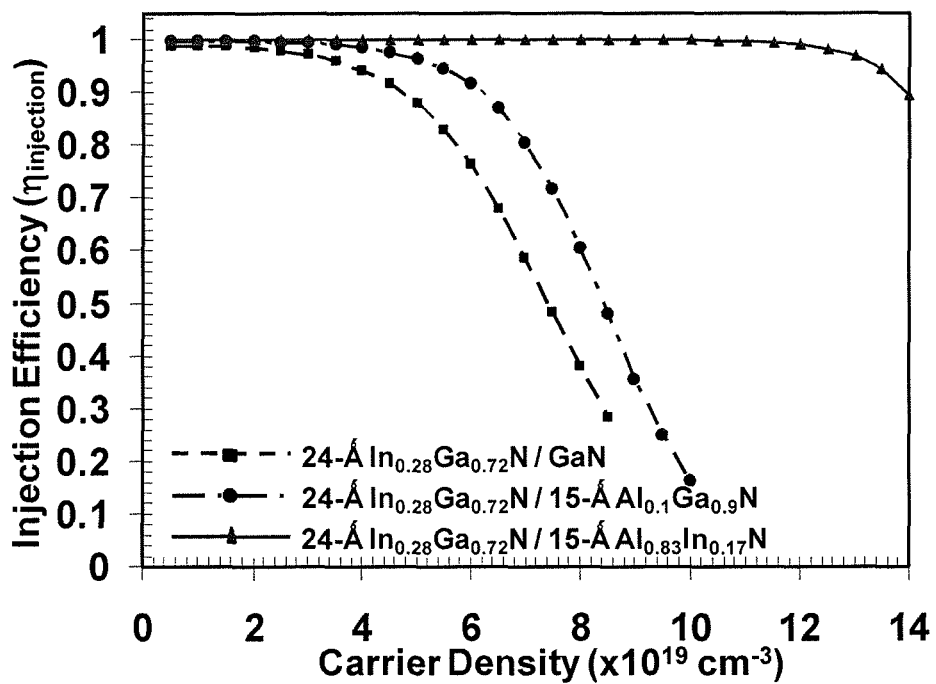
FIG. 3 is a graph of injection efficiency ($\eta_{Injection}$) as a function of carrier density for exemplary InGaN quantum well structures including a multi-layer barrier layer in comparison to a conventional InGaN quantum well.

The present invention provides a III-Nitride based (e.g., GaN-based) semiconductor LED having an enhanced internal quantum efficiency that is achieved by adding a pair of layers of a large bandgap material between the quantum well active layer and the adjacent barrier layers of a conventional quantum well structure. Accordingly, the present invention provides a III-nitride based semiconductor device including a quantum well active layer and a pair of multi-layer barrier layers arranged symmetrically about the active layer. Each multi-layer barrier layer includes an inner layer abutting the quantum well active layer; and an outer layer abutting the inner layer. The inner barrier layer has an energy bandgap characteristic greater than that of the active layer. Further, the inner barrier layer has an energy bandgap characteristic greater than that of the outer barrier layer. The large bandgap inner barrier layers act as barriers to surround the central active layer and to suppress carrier leakage from the active region, even at high carrier density, which in turn leads to reduction of efficiency-droop. In a preferred embodiment, the inner barrier layer is thinner than the outer barrier layer, and optionally, thinner also than the active layer.

Referring now to FIGS. 2-10, an exemplary quantum well 10 including symmetrical multi-layer barrier layers in accordance with the present invention is shown. More specifically, the quantum well 10 includes a centrally-located quantum well active layer 24 bounded by a pair of multi-layer barrier layers 14a, 14b arranged symmetrically in abutting relationship with the quantum well active layer 24. Each of the multi-layer barrier layers 14a, 14b includes an inner layer 20 abutting the quantum well active layer 24, and an outer barrier layer 30 abutting the inner barrier layer 20, as shown in FIG. 2. The inner layer abutting the quantum well active layer is constructed of a material having a bandgap characteristic that is relatively higher than both the outer barrier layer and the active layer. The outer layer abutting the inner layer is constructed of a material having a bandgap characteristic that is lower than that of the inner layer but higher than that of the active layer.

In the exemplary embodiment shown in FIG. 2, the lower-bandgap material of the active layer 24 is InGaN, and the higher-bandgap material of the inner barrier layers 20 is either AlInN or AlGaN. The multi-layer barrier layers 14a, 14b are symmetrical in that both inner layers comprise either AlInN or AlGaN, and both outer barrier layers 30 are u-GaN. In this exemplary embodiment, the higher bandgap inner layers 20 are thin (approximately 5 Å to approximately 20 Å) relative to the thicker lower-bandgap active layer 24 (which is approximately 50 Å to approximately 250 Å). Further, the outer barrier layers 30 are thick and have a bandgap that is both lower than that of the inner barrier layers 20 and higher than that of the active layer 24. By surrounding the lower-bandgap active layer 24 with the higher-bandgap barrier materials, significant reduction in thermionic carrier escape is achieved, even at high current density (e.g., for J>200 A/cm², and preferably up to J>650 A/cm²).

Figure 4:
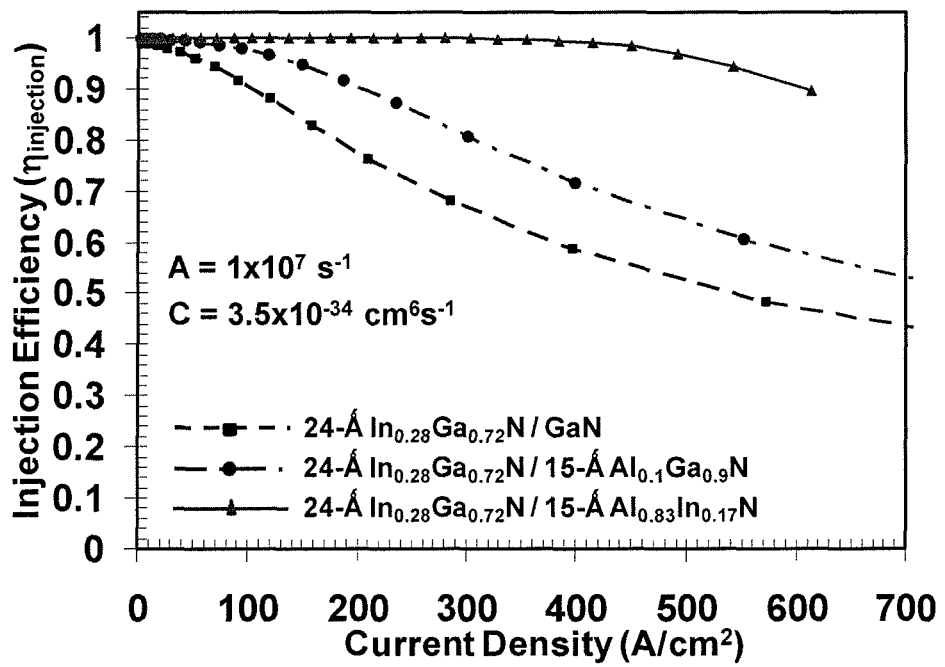
FIG. 4 is a graph of injection efficiency ($\eta_{Injection}$) as a function of total current density for exemplary InGaN quantum well structures including a multi-layer barrier layer in comparison to a conventional InGaN quantum well.

FIGS. 3 and 4 are graphs showing the comparison of the current injection efficiency ($\eta_{Injection}$) as a function of the carrier density and current density, respectively, for a quantum well comprising a 24-Å $In_{0.28}Ga_{0.72}N$ active layer 24 and employing 15-Å $Al_{0.1}Ga_{0.9}N$ inner barrier layers 20 or 15-Å $Al_{0.83}In_{0.17}N$ barrier layers 20, respectively. Low Al-content (e.g., approximately 10%) AlGaN material is slightly tensile strained with respect to the GaN material. The embodiment comprising the $Al_{0.83}In_{0.17}N$ material is employed due to the lattice-matching condition of this alloy to GaN. In each embodiment, the entire InGaN/AlGaN quantum well and InGaN/AlInN quantum well systems are surrounded by u-GaN outer barrier layers 30. In this example, the thickness of each outer barrier layer 30 is 10-nm, which is similar to conventional u-GaN barrier layer thicknesses in nitride-based LEDs grown by MOCVD.

As shown in FIGS. 3 and 4, quenching of the current injection efficiency for an InGaN/AlGaN quantum well LED in accordance with the present invention is reduced at both high carrier density or high current density, in comparison to that of a conventional InGaN—GaN quantum well LED. The InGaN/AlInN quantum well LED structure shows almost no droop up to the carrier density of $13 \times 10^{19}$ cm$^{-3}$ or current density of $J_{tot}$~500 A/cm² due to the use of thin lattice-matched $Al_{0.83}In_{0.17}N$ (Eg~4.51 eV) barriers.

It is believed that the enhancement of the injection efficiency ($\eta_{Injection}$) at high carrier density or current density for InGaN quantum wells with thin higher-bandgap inner barrier layers of AlInN or AlGaN can be attributed to the reduction of the thermionic escape rate ($1/\tau_e$), in comparison to that of InGaN/GaN quantum well structure. The suppression in thermionic carrier escape rate ($1/\tau_e$) leads to enhancement of current injection efficiency, in particular at a relatively high carrier density (e.g., $n>5\times10^{19}$ cm$^{-3}$).

Figure 5:
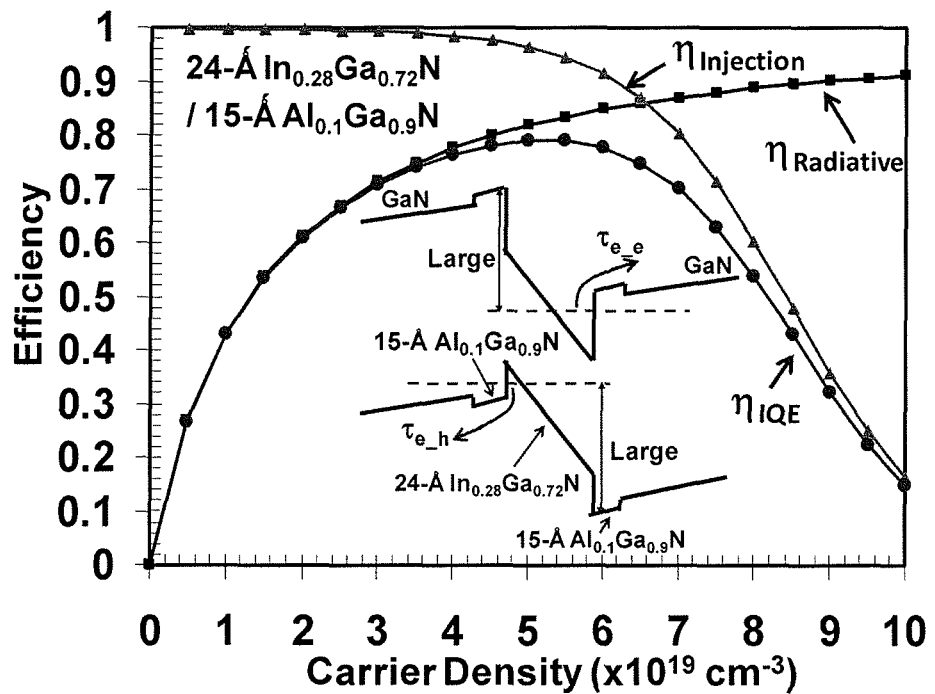
FIG. 5 is a graph of internal quantum efficiency ($\eta_{IQE}$), radiative efficiency ($\eta_{Radiative}$) and current injection efficiency ($\eta_{Injection}$) as a function of carrier density for an exemplary InGaN quantum well including an AlGaN multi-layer barrier layer in accordance with the present invention.
Figure 6:
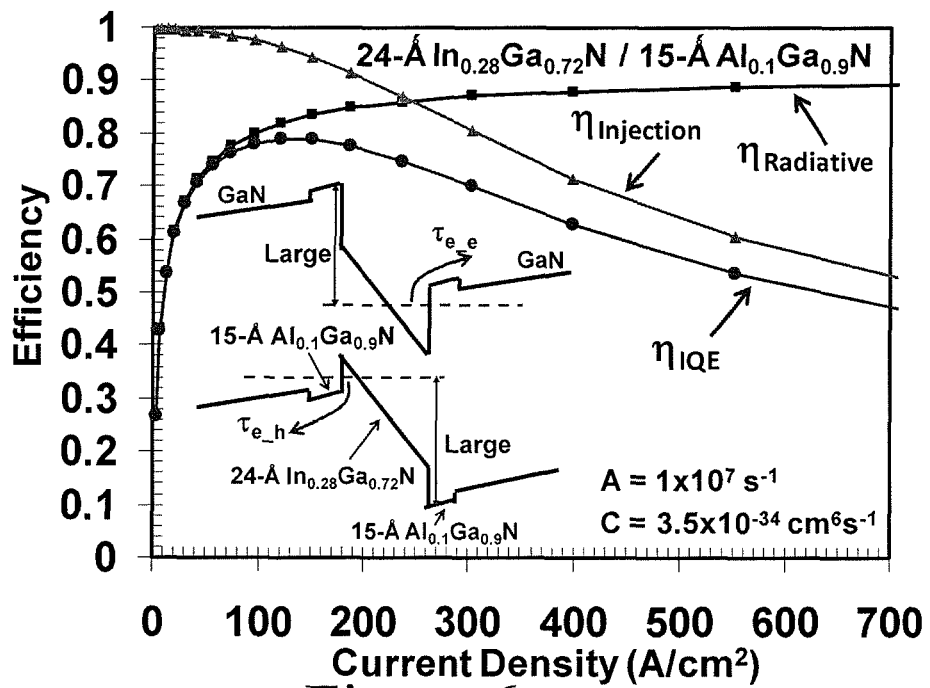
FIG. 6 is a graph of internal quantum efficiency ($\eta_{IQE}$), radiative efficiency ($\eta_{Radiative}$) and current injection efficiency ($\eta_{Injection}$) as a function of total current density for an exemplary InGaN quantum well including an AlGaN multi-layer barrier layer in accordance with the present invention.

FIGS. 5 and 6 show the radiative efficiency ($\eta_{Radiative}$), current injection efficiency ($\eta_{Injection}$), and the internal quantum efficiency ($\eta_{IQE}$) as a function of the carrier density (n) and total current density ($J_{tot}$), respectively for an exemplary quantum well including a 24-Å $In_{0.28}Ga_{0.72}N$ active layer 24 and a pair of 15-Å $Al_{0.1}Ga_{0.9}N$ inner barrier layers 20 in accordance with the present invention. The inset portions of the graphs of FIGS. 5 and 6 show the energy band lineups for the InGaN/AlGaN quantum well structure, surrounded by u-GaN barrier layers. As will be appreciated from the Figures, by utilizing an InGaN/AlGaN quantum well structure in accordance with the present invention, the radiative efficiency ($\eta_{Radiative}$) is enhanced as compared to that of a conventional InGaN/GaN quantum well. It is believed that this improvement is due to an enhanced spontaneous emission radiative recombination rate.

In addition to this improvement, the current injection efficiency ($\eta_{Injection}$) of the InGaN/AlGaN structure in accordance with the present invention is improved as well. It is believed that this improvement is due to stronger thermionic carrier suppression from the use of the thin layer of higher AlGaN barrier as compared to that of the conventional InGaN/GaN quantum well structure.

In these examples, the internal quantum efficiency ($\eta_{IQE}$) for InGaN/AlGaN LEDs reaches its peak at $n=5.6\times10^{19}$ cm$^{-3}$ (as shown in FIG. 5) or $J_{peak}\sim110\sim130$ A/cm$^2$ (as shown in FIG. 6), and the IQE reduces by 32% from its peak efficiency at $n=8\times10^{19}$ cm$^{-3}$ (see FIG. 5) or $J_{tot}\sim550$ A/cm$^2$ (see FIG. 6). Thus, the use of thin AlGaN inner barrier layers 20 in accordance with the present invention enables the InGaN quantum well LEDs to operate with higher $J_{peak}$ and slight reduction in efficiency-droop.

Figure 7:
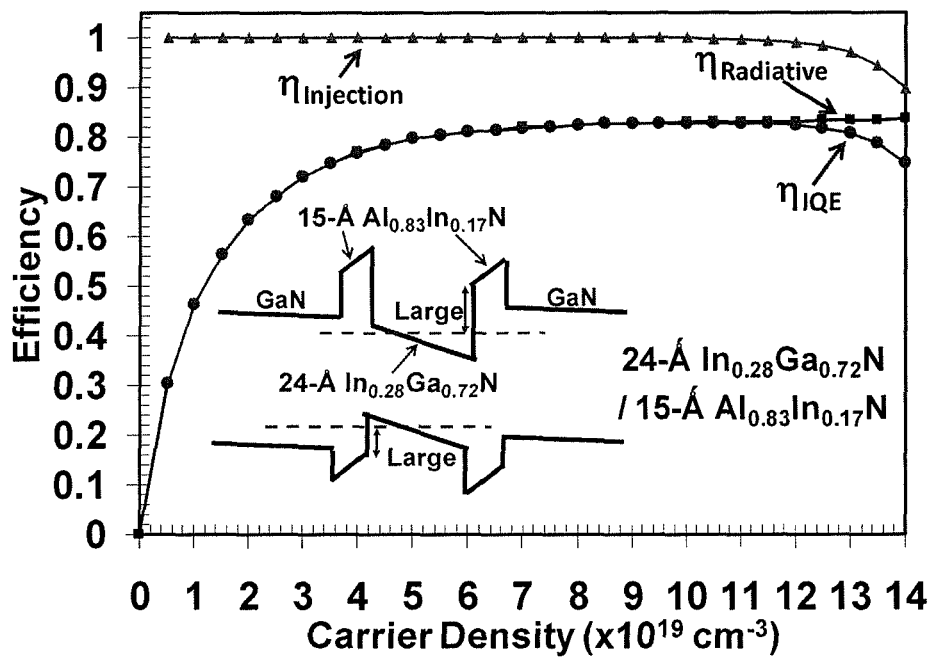
FIG. 7 is a graph of internal quantum efficiency ($\eta_{IQE}$), radiative efficiency ($\eta_{Radiative}$) and current injection efficiency ($\eta_{Injection}$) as a function of carrier density for an exemplary InGaN quantum well including an AlInN multi-layer barrier layer in accordance with the present invention.
Figure 8:
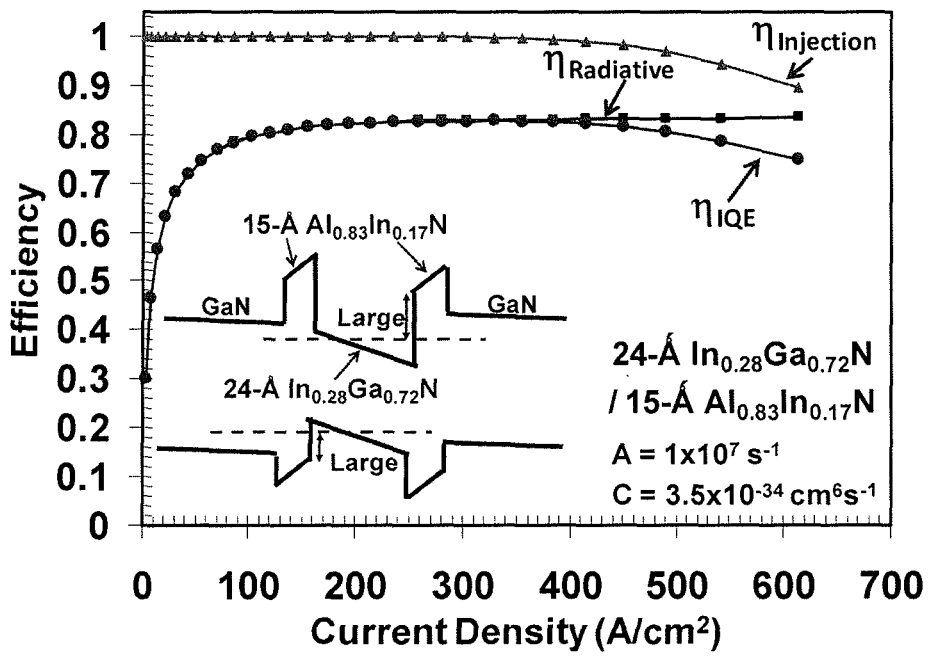
FIG. 8 is a graph of internal quantum efficiency ($\eta_{IQE}$), radiative efficiency ($\eta_{Radiative}$) and current injection efficiency ($\eta_{Injection}$) as a function of total current density for an exemplary InGaN quantum well including an AlInN multi-layer barrier layer in accordance with the present invention.

FIGS. 7 and 8 show the radiative efficiency ($\eta_{Radiative}$), current injection efficiency ($\eta_{Injection}$), and the internal quantum efficiency ($\eta_{IQE}$) as a function of the carrier density (n) and total current density ($J_{tot}$), respectively, for an exemplary embodiment of a quantum well including a 24-Å $In_{0.28}Ga_{0.72}N$ active layer 24 and a pair of 15-Å $Al_{0.83}In_{0.17}N$ inner barrier layers 20. The inset portions of FIGS. 7 and 8 show the energy band lineups for the InGaN/AlInN quantum well structures, and the structures are surrounded by u-GaN barrier layers. As will be appreciated from FIGS. 7 and 8, a slight reduction in band bending is observed for the InGaN/AlInN quantum well structure, as compared to that of InGaN/GaN or InGaN/AlGaN quantum well-barrier structures. It is believed that the larger polarization field in AlInN thin barrier layers, in comparison to that of GaN or $Al_{0.1}Ga_{0.9}N$ barrier layers, leads to a larger electrostatic field in the AlInN layers, which in turn reduces the electrostatic field and energy band bending in the InGaN/AlInN quantum well-barrier structure. By utilizing the higher-bandgap material AlInN as the thin inner barrier layers 20 to surround the InGaN active layer 24, the injection efficiency ($\eta_{Injection}$) is significantly enhanced.

The use of InGaN/AlInN quantum well LEDs leads to injection efficiency close to unity for a large range of carrier density up to $n>12.5\times10^{19}$ cm$^{-3}$, and this results in high injection efficiency with very minimum efficiency-droop up to current density above 500 A/cm$^2$. Advantageously, the internal quantum efficiency ($\eta_{IQE}$) of the InGaN/AlInN quantum well LED device starts to drop at $n\sim12.5\times10^{19}$ cm$^{-3}$ (see FIG. 7) or $J_{peak}\sim450$ A/cm$^2$ (see FIG. 8). Further, the internal quantum efficiency ($\eta_{IQE}$) is reduced by only 10% from its peak efficiency value at $n=14\times10^{19}$ cm$^{-3}$ (see FIG. 7) or $J_{tot}\sim620$ A/cm$^2$ (FIG. 8).

It is noted that the radiative efficiency of the exemplary InGaN/AlInN quantum well structure is slightly lower as compared to that of a conventional InGaN/GaN quantum well. It is believed that this is due to the existence of only one confined state in the quantum well. Advantageously, the use of thin AlInN inner barrier layers in accordance with the present invention leads to stronger electron and hole confinement due to the increasing quantum size effect, which in turn leads to an increase in the quantized fundamental energy levels for both electrons and holes in the quantum well. Due to the strong confinement and the use of the thin AlInN barrier layers, the excited states in the conduction and valence bands of the exemplary InGaN/AlInN quantum well structure are not confined. However, due to the much superior injection efficiency from the InGaN/AlInN quantum well LEDs, the IQE is enhanced significantly at high operating current density.

Figure 9:
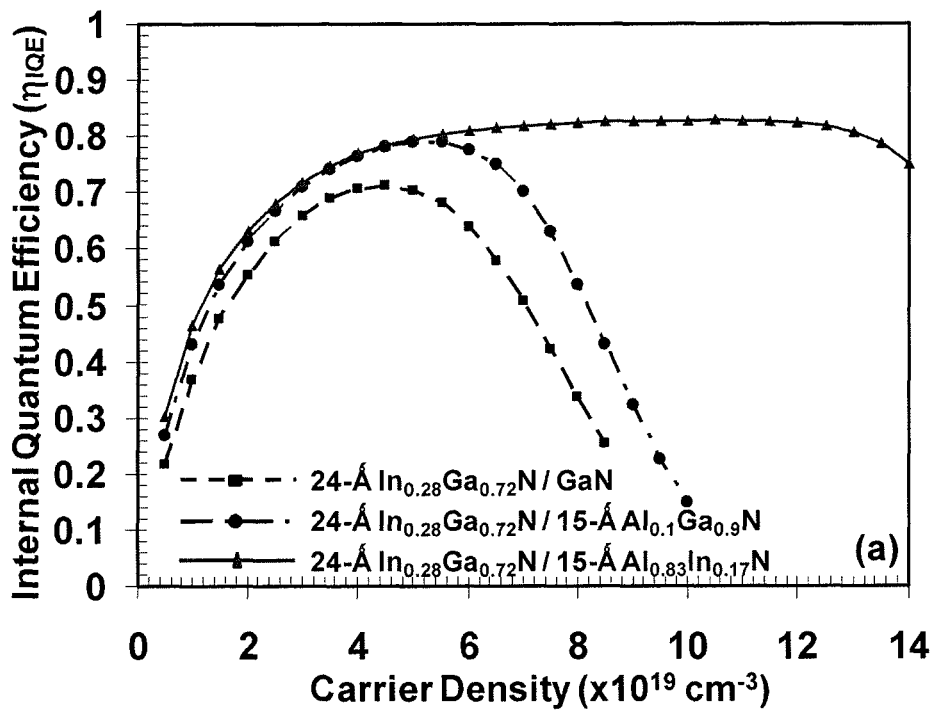
FIG. 9 is a graph of internal quantum efficiency ($\eta_{IQE}$) as a function of carrier density for exemplary InGaN quantum wells including AlGaN and AlInN multi-layer barrier layers in accordance with the present invention in comparison to a conventional InGaN/GaN quantum well.
Figure 10:
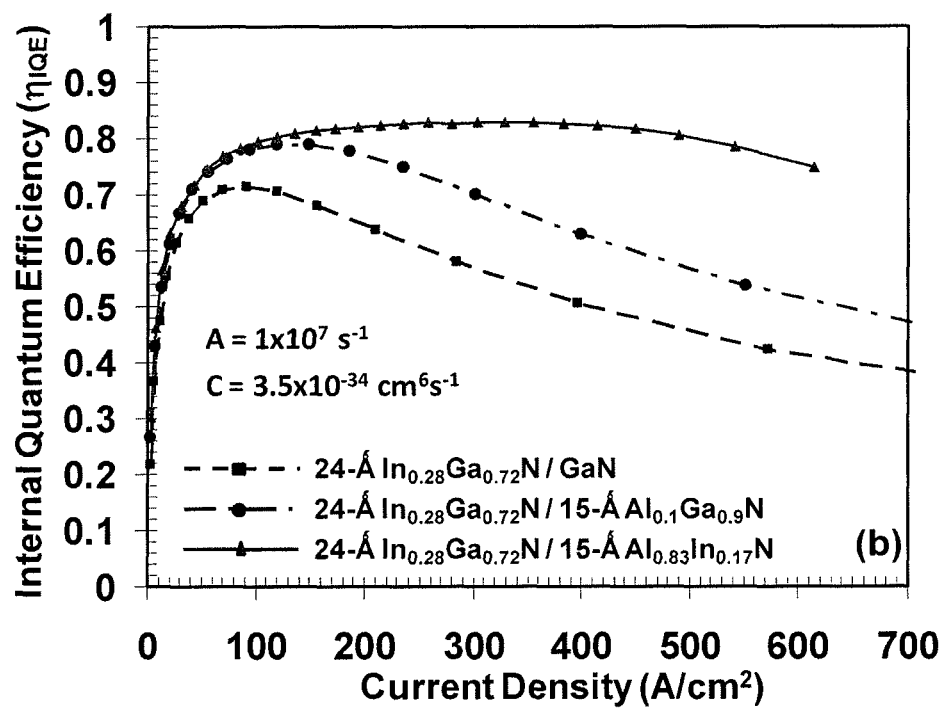
FIG. 10 is a graph of internal quantum efficiency ($\eta_{IQE}$) as a function of total current density for exemplary InGaN quantum wells including AlGaN and AlInN multi-layer barrier layers in accordance with the present invention in comparison to a conventional InGaN/GaN quantum well.

FIGS. 9 and 10 are graphs showing a comparison of the internal quantum efficiency ($\eta_{IQE}$) for three quantum well structures, namely, a conventional 24-Å $In_{0.28}Ga_{0.72}N$/GaN quantum well, a 24-Å $In_{0.28}Ga_{0.72}N$/15-Å $Al_{0.1}Ga_{0.9}N$ quantum well in accordance with the present invention, and a 24-Å $In_{0.28}Ga_{0.72}N$/15-Å $Al_{0.83}In_{0.17}N$ in accordance with the present invention. This graphical comparison shows the enhancement of the IQE for the quantum well structures with thin inner barrier layers of $Al_{0.1}Ga_{0.9}N$ or $Al_{0.83}In_{0.17}N$. As will be noted from the Figures, a slight enhancement of the IQE is observed for the InGaN quantum well LED structure employing AlGaN thin inner barrier layers. The use of AlInN barrier layers leads to higher IQE and reduced efficiency-droop throughout a large current density range up to high current density of J>500 A/cm$^2$.

It is believed that keeping the barrier layers thin (e.g., approximately 15 Å) is helpful to ensuring the compatibility of the structure for epitaxy of InGaN quantum well LEDs. Further, it is believed that the use of low Al-content (e.g., 10%) and very thin layers of AlGaN barriers is helpful for enabling the growth of a high-quality InGaN/AlGaN quantum well structure. Further, it is believed that preferred growth temperatures for AlInN epitaxy by metalorganic chemical vapor deposition (MOCVD) range from $T_g\sim750°$ C. up to $T_g\sim780°$ C., which is compatible with that of InGaN quantum well epitaxy.

The quantum wells and semiconductor LEDs in accordance with the present invention may be formed using conventional manufacturing techniques, e.g., growing by III-V semiconductor MOCVD/MBE epitaxy and molecular beam epitaxy (MBE), through the use of metal organic chemical vapor deposition (MOCVD) growth. Further, the quantum wells with symmetrical multi-layer barrier layers may be incorporated into various devices and be used in a conventional manner. By way of example, the quantum wells with symmetrical multi-layer barrier layers may be employed in various types of optoelectronic devices including amplifiers, light emitting diodes and edge emitting and surface emitting lasers that incorporate optical feedback to provide lasing action, and may have application in solid state lighting, solid state displays, lasers, light emitting diodes (LEDs), biomedical therapy and diagnostic devices, medical lasers, eye surgery devices and DVD lasers.

In one embodiment, the present invention provides a quantum well with a symmetrical multi-layer barrier layer. In another embodiment, the present invention provides a III-nitride based semiconductor device including the quantum well with symmetrical multi-layer barrier layers. In yet another embodiment, the present invention provides an optoelectronic device including the quantum well with symmetrical multi-layer barrier layers. In still another embodiment, the present invention provides a semiconductor laser including the quantum well with symmetrical multi-layer barrier layers.

While the present invention has been particularly shown and described with reference to the preferred mode as illustrated in the drawing, it will be understood by one skilled in the art that various changes in detail may be effected therein without departing from the spirit and scope of the invention as defined by the claims.

What is claimed is:

1. A III-nitride based semiconductor device comprising:
   a quantum well active layer of a first nitride-based material having a first bandgap characteristic; and
   a pair of multi-layer barrier layers arranged symmetrically in abutting relationship with said quantum well active layer, each of said pair of multi-layer barrier layers comprising:
      an inner layer abutting said quantum well active layer, said inner layer being formed of a second nitride-based material having a second bandgap characteristic greater than said first bandgap characteristic; and
      an outer layer abutting said inner layer, said outer layer being formed of a third nitride-based material having a third bandgap characteristic greater than said first bandgap characteristic and less than said second bandgap characteristic, said outer barrier layer having a thickness and material composition causing it to function primarily as a barrier layer and not as a light guiding layer.

2. The III-nitride based semiconductor device of claim 1, wherein each of said inner layers is thin relative to each of said outer layers.

3. The III-nitride based semiconductor device of claim 2, wherein each of said inner layers has a thickness measuring approximately 15 Å or less.

4. The III-nitride based semiconductor device of claim 3, wherein each of said inner layers comprises AlInN.

5. The III-nitride based semiconductor device of claim 3, wherein each of said inner layers comprises AlGaN.

6. The III-nitride based semiconductor device of claim 3, wherein each of said inner layers comprises AlInGaN.

7. The III-nitride based semiconductor device of claim 1, wherein said quantum well active layer comprises InGaN.

8. The III-nitride based semiconductor device of claim 1, wherein each of said outer layers comprises GaN.

9. The III-nitride based semiconductor device of claim 1, wherein each one of said inner barrier layers has a thickness measuring approximately 5 Å to approximately 15 Å, and wherein each one of said outer barrier layers has a thickness measuring approximately 50 Å to approximately 150 Å.

10. A III-nitride based semiconductor device comprising:
    a quantum well active layer of InGaN;
    a pair of multi-layer barrier layers arranged symmetrically in abutting relationship with said quantum well active layer, each of said pair of multi-layer barrier layers comprising:
    a thin inner layer abutting said quantum well active layer, said thin inner layer having a thickness of less than approximately 15 Å and being formed of a material selected from the group consisting of AlInN, AlInGaN, and AlGaN; and
    a thick outer layer abutting said thin inner layer, said thick layer being formed of u-GaN and being thicker than said thin inner layer.

11. The III-nitride based semiconductor device of claim 10, wherein said quantum well active layer has a thickness measuring approximately 20 Å to approximately 50 Å, each of said thin inner layers having a thickness measuring approximately 5 Å to approximately 15 Å, and each of said thick outer layer having a thickness measuring approximately 50 Å to approximately 100 Å.

* * * * *